United States Patent
Cho et al.

(10) Patent No.: US 10,734,161 B2
(45) Date of Patent: Aug. 4, 2020

(54) MULTILAYER ELECTRONIC COMPONENT AND BOARD HAVING THE SAME

(71) Applicant: SAMSUNG ELECTRO-MECHANICS CO., LTD., Suwon-si, Gyeonggi-do (KR)

(72) Inventors: Beom Joon Cho, Suwon-si (KR); Ki Young Kim, Suwon-si (KR); Jae Young Na, Suwon-si (KR); Jin Mo Ahn, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 20 days.

(21) Appl. No.: 15/995,637

(22) Filed: Jun. 1, 2018

(65) Prior Publication Data

US 2019/0122823 A1 Apr. 25, 2019

(30) Foreign Application Priority Data

Oct. 19, 2017 (KR) .................. 10-2017-0136031

(51) Int. Cl.
*H01G 4/30* (2006.01)
*H01G 4/232* (2006.01)
(Continued)

(52) U.S. Cl.
CPC .............. *H01G 4/30* (2013.01); *H01G 2/06* (2013.01); *H01G 4/005* (2013.01);
(Continued)

(58) Field of Classification Search
CPC .......... H01G 4/224; H01G 4/248; H01G 4/30; H01G 4/38; H01G 4/012; H01G 4/1227;
(Continued)

(56) References Cited

U.S. PATENT DOCUMENTS

| 6,373,714 B1 | 4/2002 | Kudoh et al. |
| 2004/0183147 A1* | 9/2004 | Togashi ................ H01G 2/065 257/414 |

(Continued)

FOREIGN PATENT DOCUMENTS

| JP | H11-074147 A | 3/1999 |
| JP | 2004-273935 A | 9/2004 |

(Continued)

OTHER PUBLICATIONS

Office Action issued in related Korean Application No. 10-2017-0136031 dated Jan. 30, 2019, with English translation.

*Primary Examiner* — Michael P McFadden

(74) *Attorney, Agent, or Firm* — Morgan, Lewis & Bockius LLP

(57) ABSTRACT

A multilayer electronic component includes first and second frame terminals, and first and second electronic components. The first frame terminal includes a first side frame and a first bottom frame extended from a lower end of the first side frame. The second frame terminal includes a second side frame facing the first side frame and a second bottom frame extended from a lower end of the second side frame. The first electronic component is disposed between the first and second side frames, and the second electronic component is stacked on the first electronic component and disposed between the first and second side frames. Conductive adhesives are provided between the first and second side frames and the first and second electronic components, but a conductive adhesive is not formed between the first and second side frames and portions of the first electronic component close to a mounting surface.

15 Claims, 8 Drawing Sheets

(51) Int. Cl.
*H01G 4/005* (2006.01)
*H05K 3/34* (2006.01)
*H01G 4/12* (2006.01)
*H01G 4/38* (2006.01)
*H01G 2/06* (2006.01)
*H05K 1/18* (2006.01)

(52) U.S. Cl.
CPC ........... *H01G 4/1227* (2013.01); *H01G 4/232* (2013.01); *H01G 4/38* (2013.01); *H05K 3/3426* (2013.01); *H05K 3/3442* (2013.01); *H05K 1/181* (2013.01); *H05K 2201/10015* (2013.01); *H05K 2201/1053* (2013.01); *H05K 2201/10515* (2013.01); *H05K 2201/10946* (2013.01)

(58) Field of Classification Search
CPC ........ H01G 4/1245; H01G 2/06; H01G 4/005; H01G 4/232; H05K 3/3426; H05K 3/3442; H05K 1/181; H05K 2201/10015; H05K 2201/10515; H05K 2201/1053; H05K 2201/10946

USPC .............................. 361/307.1, 321.2
See application file for complete search history.

(56) References Cited

U.S. PATENT DOCUMENTS

| 2015/0114697 | A1* | 4/2015 | Murrell | H01G 4/232 174/255 |
| 2016/0071650 | A1* | 3/2016 | McConnell | B23K 1/0016 29/25.42 |
| 2016/0205769 | A1* | 7/2016 | Park | H01G 4/224 174/260 |
| 2016/0212843 | A1  | 7/2016 | Park et al. | |
| 2016/0219739 | A1* | 7/2016 | Park | H01G 4/30 |

FOREIGN PATENT DOCUMENTS

| KR | 10-2000-0047509 A | 7/2000 |
| KR | 10-2016-0089738 A | 7/2016 |
| KR | 10-2016-0092251 A | 8/2016 |

* cited by examiner

MULTILAYER ELECTRONIC COMPONENT AND BOARD HAVING THE SAME

CROSS-REFERENCE TO RELATED APPLICATION(S)

This application claims benefit of priority to Korean Patent Application No. 10-2017-0136031 filed on Oct. 19, 2017 in the Korean Intellectual Property Office, the disclosure of which is incorporated herein by reference in its entirety.

BACKGROUND

1. Field

The present disclosure relates to a multilayer electronic component and a board having the same.

2. Description of Related Art

A multilayer electronic component may have a small size and high capacitance, such that the multilayer electronic component can be used in various electronic devices.

Recently, due to rapid rise of eco-friendly vehicles and electric vehicles, demand has increased for vehicle power driving systems that include capacitors, such that demand for a multilayer electronic components such as a multilayer capacitors used in such vehicles has increased.

In order to be used as a component for a vehicle, the multilayer electronic component should have a high level of thermal resistance or electrical reliability, and the performance parameters of the multilayer electronic component may be upgraded.

Therefore, demand for a multilayer electronic component capable of implementing high capacitance in a limited space or having excellent durability against vibrations or deformation has increased.

In a multilayer capacitor according to the related art, it may be difficult to secure a high level of reliability in a multilayer capacitor since a ceramic body of the capacitor and the circuit board may each come into direct contact with solder at the time of mounting the multilayer capacitor on a circuit board and heat or mechanical deformation generated in the circuit board may thus be directly transferred to the capacitor.

Therefore, recently, a method of preventing stress from a circuit board from being directly transferred to the multilayer capacitor has been suggested whereby a metal frame is adhered to a side surface of a multilayer capacitor to secure an interval between the multilayer capacitor and the circuit board.

Here, in order to increase resistance against warpage cracks of the multilayer capacitor to which the metal frame is adhered, there is a need to secure sufficient length in a portion of the metal frame that is not adhered to the multilayer capacitor.

However, in the multilayer capacitor according to the related art, in order to secure the length of the metal frame, there is no alternative but to increase a length of the frame itself. In this case, a height of a component may be increased.

However, in a module type multilayer electronic component in which a plurality of capacitors are mounted in order to implement high capacitance, it is important to control a height of the component. As such, a need exists for a method of significantly limiting an increase in height of an overall component while sufficiently securing the length of the portion of the metal frame that is not adhered to the capacitor.

SUMMARY

An aspect of the present disclosure may provide a multilayer electronic component capable of decreasing a height of an overall component while having high capacitance, high durability against thermal stress and mechanical stress, and high reliability, and a board having the same.

According to an aspect of the present disclosure, a multilayer electronic component may include first and second frame terminals and first and second electronic components. The first frame terminal includes a first side frame extended in a first direction and a first bottom frame extended from a lower end of the first side frame in a second direction. The second frame terminal includes a second side frame facing the first side frame and extended in the first direction and a second bottom frame extended from a lower end of the second side frame in a third direction opposite to the second direction. The first electronic component is disposed between the first and second side frames, and the second electronic component is disposed on the first electronic component and between the first and second side frames. Conductive adhesives are disposed between the first and second side frames and the first and second electronic components, respectively. Regions between the first and second side frames and portions of the first electronic component close to amounting surface are free of conductive adhesives such that a space portion is provided therebetween.

Each of the first and second electronic components may include a ceramic body and external electrodes disposed on an outer surface of the ceramic body, and the external electrodes of the first and second electronic components are connected to each other by a conductive adhesive.

In each of the first and second electronic components, the ceramic body may include a plurality of dielectric layers and a plurality of first and second internal electrodes alternately disposed with respective dielectric layers interposed therebetween, and may have first and second surfaces opposing each other, and third and fourth surfaces connected to the first and second surfaces and opposing each other, and fifth and sixth surfaces connected to the first and second surfaces and the third and fourth surfaces and opposing each other, one end of each first and second internal electrode may be exposed to the third and fourth surfaces of the body, respectively. The first and second external electrodes may be disposed on the third and fourth surfaces of the ceramic body and connected to the first and second internal electrodes and the first and second side frames, respectively.

A lower end of the first electronic component may be disposed to be spaced apart from the mounting surface.

The multilayer electronic component may further include a sealing part enclosing at least portions of the first and second electronic components.

The sealing part may be formed to partially expose a lower portion of the first electronic component and to fully enclose the second electronic component.

The relation $(T1)/4 < h < T1+d$ may be observed in which h is a height of portions of the first and second side frames free of the conductive adhesives and spaced apart from the first electronic component, d is a distance between the first electronic component and the mounting surface, and T1 is a height of the first electronic component.

The relation h<T1+d+0.5 mm may be observed in which h is a height of portions of the first and second side frames free of the conductive adhesives and spaced apart from the first electronic component, d is a distance between the first electronic component and the mounting surface, and T1 is a height of the first electronic component.

According to another aspect of the present disclosure, a board having a multilayer electronic component may include a circuit board having one surface on which first and second electrode pads are formed, and the multilayer electronic component described above, mounted on the first and second electrode pads so that the first and second bottom frames of the first and second frame terminals are connected to the first and second electrode pads, respectively.

According to a further aspect of the present disclosure, a multilayer electronic component may include first and second electronic components and first and second frame terminals. The first electronic component has first and second opposing outer surfaces and third and fourth opposing outer surfaces. The second electronic component has fifth and sixth opposing outer surfaces, and the second electronic component is mounted facing the third outer surface of the first electronic component to have the first and fifth outer surfaces aligned with each other and the second and sixth outer surfaces aligned with each other. The first frame terminal is adhered to the first and fifth outer surfaces, and extends past the fourth outer surface to include a first bottom frame. The second frame terminal is adhered to the second and sixth outer surfaces, and extends past the fourth outer surface to include a second bottom frame.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments will be described in detail with reference to the accompanying drawings.

Figure 1:
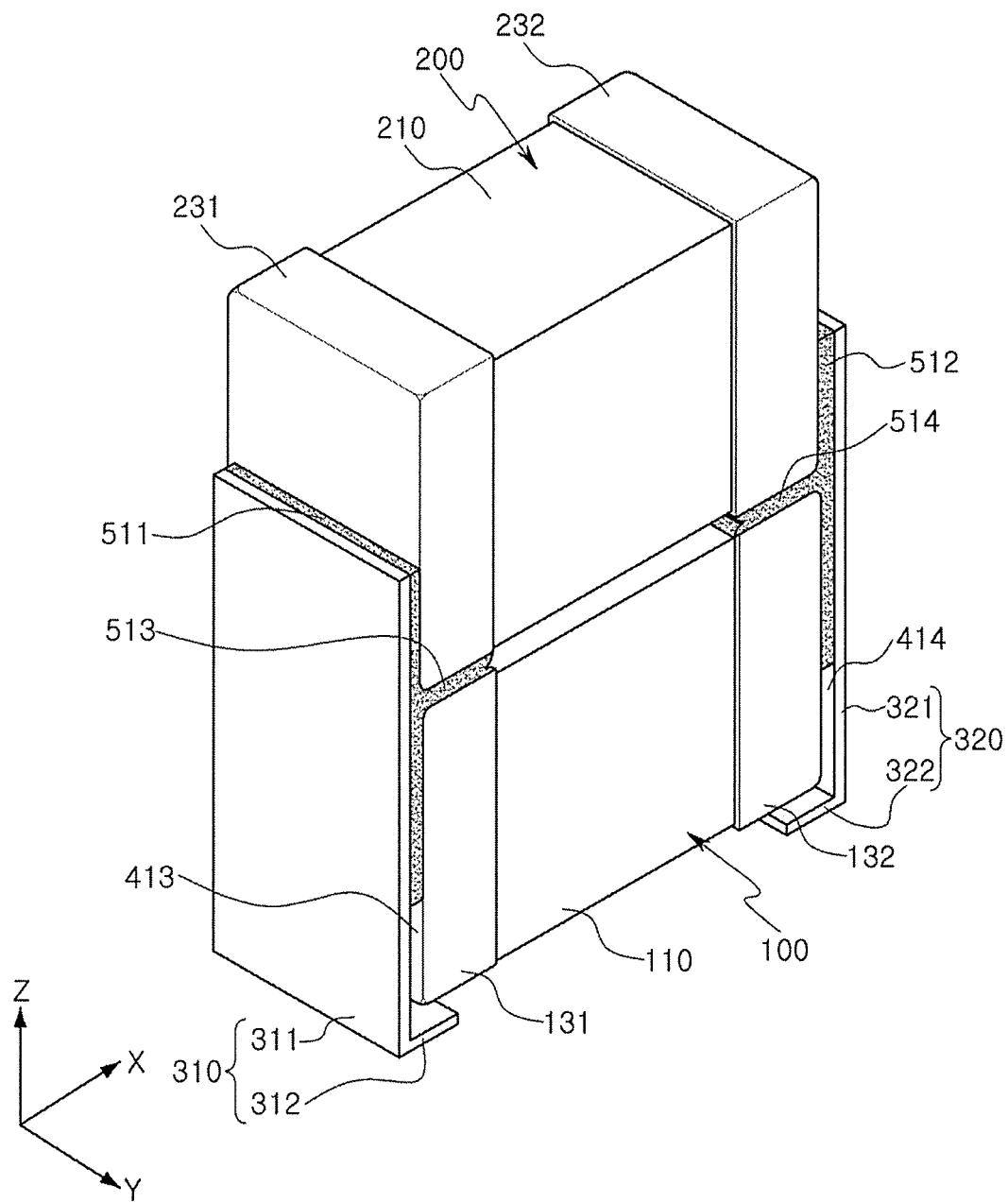
FIG. 1 is a perspective view schematically illustrating a multilayer electronic component according to an exemplary embodiment.
Figure 2:
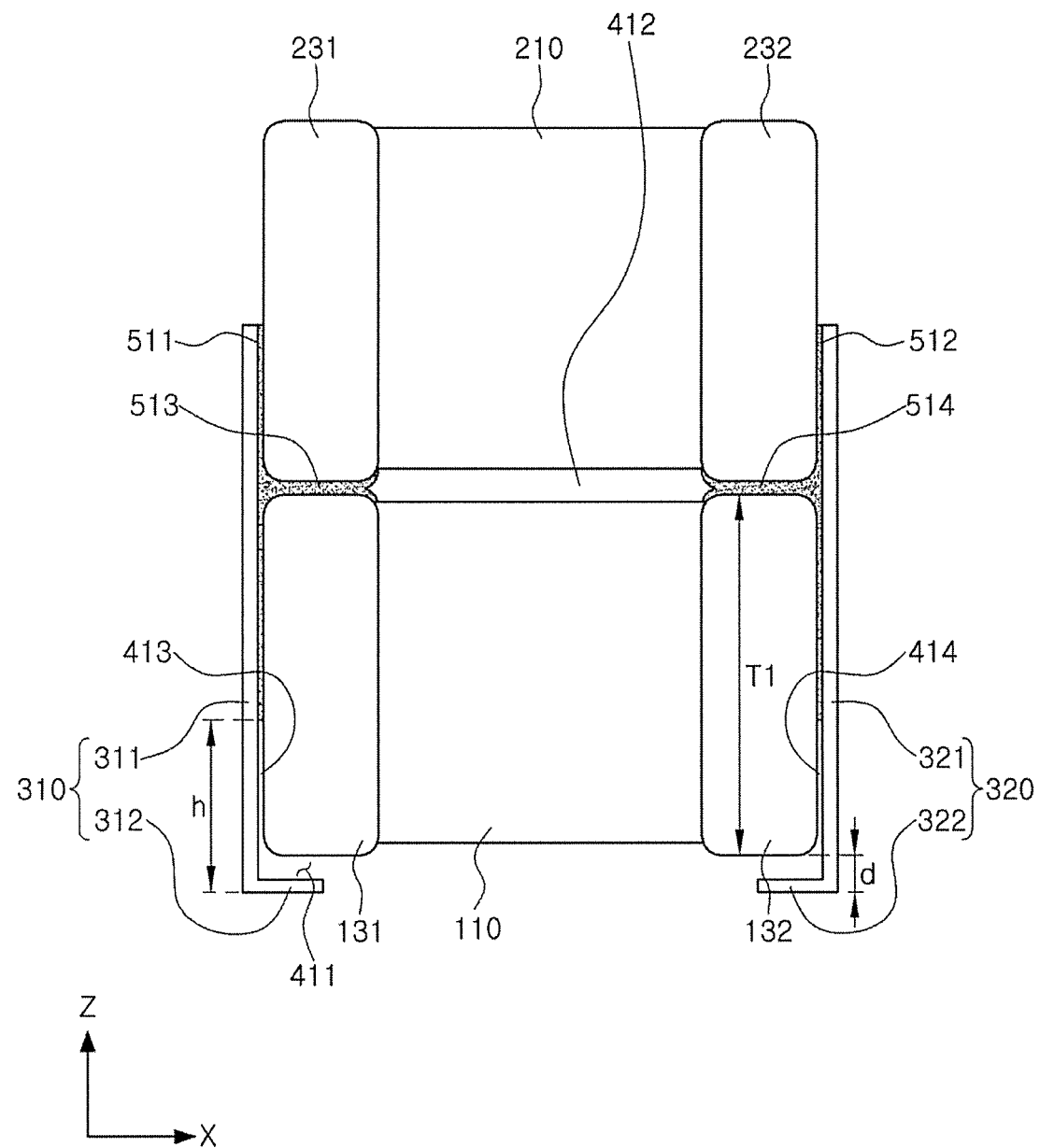
FIG. 2 is a front view of the multilayer electronic component of FIG. 1.
Figure 3:
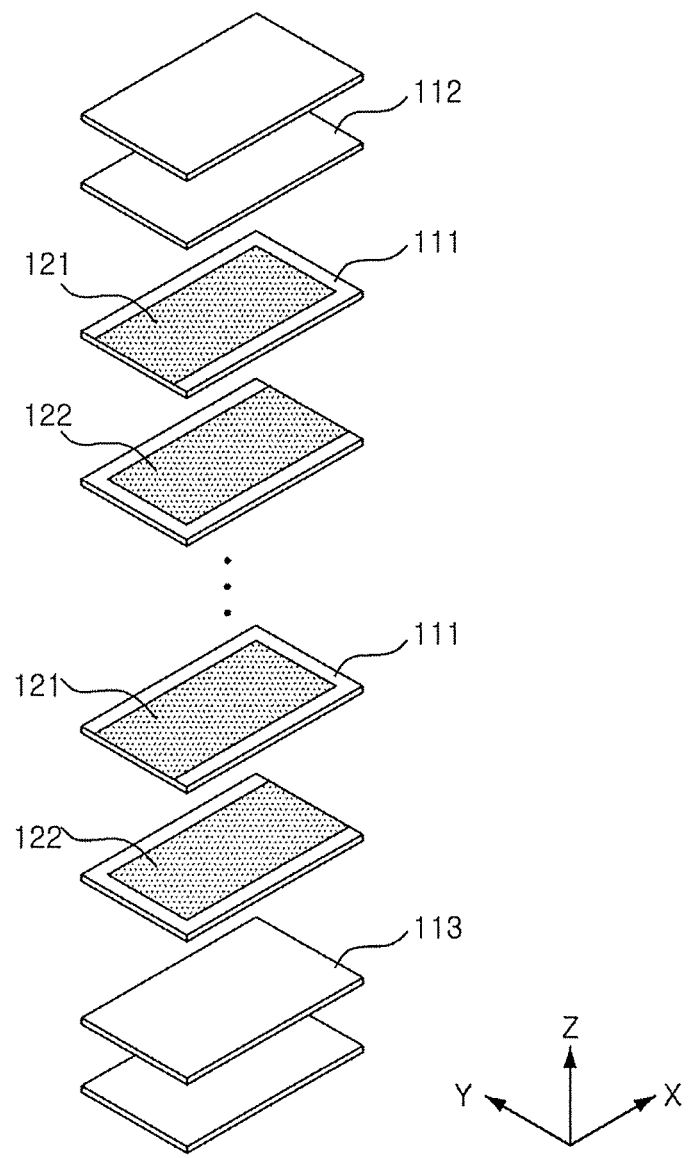
FIG. 3 is an exploded perspective view illustrating a stacking structure of internal electrodes in the multilayer electronic component according to the exemplary embodiment.

FIG. 1 is a perspective view schematically illustrating a multilayer electronic component according to an exemplary embodiment, FIG. 2 is a front view of the multilayer electronic component of FIG. 1, and FIG. 3 is an exploded perspective view illustrating a stacking structure of internal electrodes in the multilayer electronic component according to the exemplary embodiment.

Directions of ceramic bodies 110 and 210 will be defined in order to clearly describe exemplary embodiments in the present disclosure. X, Y, and Z illustrated in the accompanying drawings refer to length directions, width directions, and thickness directions of the ceramic bodies 110 and 210, respectively. Here, the thickness direction may be the same as a stacking direction in which dielectric layers 111 are stacked.

Referring to FIGS. 1 through 3, the multilayer electronic component according to the exemplary embodiment may include first and second electronic components 100 and 200; and first and second frame terminals 310 and 320.

The first frame terminal 310 may include a first side frame 311 extended in a first direction and a first bottom frame 312 extended from a lower end of the first side frame 311 in a second direction.

The second frame terminal 320 may include a second side frame 321 facing the first side frame 311 and extended in the first direction and a second bottom frame 322 extended from a lower end of the second side frame 321 in a third direction.

Here, the first direction may be defined as a direction perpendicular to a mounting surface or a downward direction in the Z direction corresponding to the thickness direction of the ceramic body.

Further, the second direction may refer to one direction substantially perpendicular to the first direction, and the third direction may be defined as a direction substantially perpendicular to the first direction but opposite to the second direction.

Due to the above-mentioned structure, the first and second frame terminals 310 and 320 may each substantially have an 'L' letter shape and be disposed so that end portions of the first and second frame terminals 310 and 320 face each other, respectively (e.g., such that the first and second bottom frames 312 and 322 extends towards each other from their respective first and second side frames 311 and 321).

In addition, a first electronic component 100 may be disposed between the first and second side frames 311 and 321, and a second electronic component 200 may be disposed on the first electronic component 100. A space or gap 412 may be provided between the first and second electronic components.

The first electronic component 100 may include the ceramic body 110 and first and second external electrodes 131 and 132 disposed on an outer surface of the ceramic body 110, and the second electronic component 200 may include the ceramic body 210 and first and second external electrodes 231 and 232 disposed on an outer surface of the ceramic body 210.

The first external electrode 131 of the first electronic component 100 and the first external electrode 231 of the second electronic component 200 may be connected to the first frame terminal 310, and the second external electrode 132 of the first electronic component 100 and the second external electrode 232 of the second electronic component 200 may be connected to the second frame terminal 320.

In addition, the second electronic component 200 may be stacked on the first electronic component 100.

Here, upper band portions of the first and second external electrodes 131 and 132 of the first electronic component 100 and lower band portions of the first and second external electrodes 231 and 232 of the second electronic component 200 may be electrically connected to each other respectively.

Further, conductive adhesives 513 and 514 may be disposed between the first external electrode 131 of the first electronic component 100 and the first external electrode 231 of the second electronic component 200 and between the second external electrode 132 of the first electronic component 100 and the second external electrode 232 of the second electronic component 200, respectively, such that the external electrodes positioned to face each other in a vertical direction may be adhered to each other, and a state in the first and second electronic components 100 and 200 are stacked may be stably maintained.

The conductive adhesives 513 and 514 may contain a high-temperature solder, a conductive resin paste, or the like, but a material of the conductive adhesives 513 and 514 is not limited thereto.

In addition, the first external electrode 131 of the first electronic component 100 and the first external electrode 231 of the second electronic component 200 may be connected to the first side frame 311 of the first frame terminal 310, and the second external electrode 132 of the first electronic component 100 and the second external electrode 232 of the second electronic component 200 may be connected to the second side frame 321 of the second frame terminal 320.

Here, the first external electrode 131 of the first electronic component 100 and the first external electrode 231 of the second electronic component 200 may be connected to the first frame terminal 310 by a conductive adhesive 511, and the second external electrode 132 of the first electronic component 100 and the second external electrode 232 of the second electronic component 200 may be connected to the second frame terminal 320 by a conductive adhesive 512.

The conductive adhesives 511 and 512 may contain a high-temperature solder, a conductive resin paste, or the like, but a material of the conductive adhesives 511 and 512 is not limited thereto.

Meanwhile, in the present exemplary embodiment, an interval of height d (in the Z direction) may be formed between a lower end of the first electronic component 100 and the mounting surface.

That is, a space portion 411 may be provided between the first and second external electrodes 131 and 132 of the first electronic component 100 and the first and second bottom frames 312 and 322.

Therefore, at the time of mounting the multilayer electronic component on a circuit board, the space portion may prevent deformation stress of the circuit board from being directly transferred to the first electronic component 100.

Further, in the present exemplary embodiment, space portions 413 and 414, which are non-contact portions of height h (in the Z direction) in which the conductive adhesives 511 and 512 are not formed, may be provided between the first and second side frames 311 and 312 and the first and second external electrodes 131 and 132 of the first electronic component 100, respectively.

Since the first and second frame terminals 310 and 320 may move separately from the first electronic component 100 due to these space portions 413 and 414, external stress such as the deformation stress of the circuit board as described above, or the like, may be absorbed by the first and second frame terminals 310 and 320, such that reliability of the multilayer electronic component may be improved.

Here, the space portions 413 and 414 may be provided to be close to the mounting surface in the Z direction, and the first and second frame terminals 310 and 320 may act like a spring, such that an effect of absorbing external stress may be more effectively exhibited.

The first and second electronic components 100 and 200 according to the present exemplary embodiment may be multilayer capacitors, and may include the ceramic body 110 and 210 and the first and second external electrodes 131 and 132, and 231 and 232, respectively.

Hereinafter, in describing a structure of the electronic component, a structure of the first electronic component 100 is described by way of example, but since configurations of the first and second electronic components are similar to each other, this description may also be applied to the second electronic component.

The ceramic body 110 of the first electronic component 100 may be formed by stacking a plurality of dielectric layers 111 in the Z direction and then sintering the stacked dielectric layers 111. The plurality of dielectric layers 111 may each have a first or a second internal electrode 121 and 122 disposed thereon, and dielectric layers 111 with the first and second internal electrodes 121 and 122 thereon may be alternately stacked to form the ceramic body.

In addition, if necessary, upper and lower covers 112 and 113 having a predetermined thickness may be formed in upper and lower portions of the ceramic body 110 in the Z direction.

In this case, the respective adjacent dielectric layers 111 of the ceramic body 110 may be integrated with each other so that boundaries therebetween are not readily apparent.

The ceramic body 110 may generally have a hexahedral shape. However, a shape of the ceramic body 110 is not limited thereto.

In the present exemplary embodiment, for convenience of explanation, both surfaces of the ceramic body 110 opposing each other in the Z direction will be defined as first and second surfaces, both surfaces of the ceramic body 110 connected to the first and second surfaces and opposing each other in the X direction will be defined as third and fourth surfaces, and both surfaces of the ceramic body 110 connected to the first, second, third, and fourth surfaces and opposing each other in the Y direction will be defined as fifth and sixth surfaces. In the present exemplary embodiment, the first surface corresponding to a lower surface may become a mounting surface in a mounting direction.

In addition, the dielectric layer 111 may contain a ceramic material having high permittivity such as $BaTiO_3$ based ceramic powder, or the like. However, the material of the dielectric layer 111 is not limited thereto.

The $BaTiO_3$ based ceramic powder may be, for example, $(Ba_{1-x}Ca_x)TiO_3$, $Ba(Ti_{1-y}Ca_y)O_3$, $(Ba_{1-x}Ca_x)(Ti_{1-y}Zr_y)O_3$, or $Ba(Ti_{1-y}Zr_y)O_3$ in which Ca, Zr, and the like, are partially solid-dissolved in $BaTiO_3$, or the like, but an example of the $BaTiO_3$ based ceramic powder is not limited thereto.

Further, a ceramic additive, an organic solvent, a plasticizer, a binder, a dispersant, and the like, may be further added to the dielectric layer 111 together with the ceramic powder. As the ceramic additive, for example, a transition metal oxide or carbide, rare earth elements, magnesium (Mg), aluminum (Al), or the like, may be used.

The first and second internal electrodes 121 and 122, which are electrodes having different polarities from each other, may be alternately disposed to face each other in the Z direction with each of the dielectric layers 111 interposed therebetween. One end of the first internal electrodes 121 may be exposed to the third surface, and one end of the second internal electrodes 122 may be exposed to the fourth surfaces of the ceramic body 110.

Here, the first and second internal electrodes 121 and 122 may be electrically insulated from each other by the dielectric layer 111 disposed therebetween.

End portions of the first and second internal electrodes 121 and 122 alternately exposed to the third and fourth surfaces of the ceramic body 110 may be electrically connected to the first and second external electrodes 131 and 132, respectively.

In this case, the first and second internal electrodes 121 and 122 may be formed of a conductive metal, for example, nickel (Ni), a nickel (Ni) alloy, or the like. However, a material of the first and second internal electrodes 121 and 122 is not limited thereto.

Due to the above-mentioned configuration, when a predetermined voltage is applied between the first and second external electrodes 131 and 132, electric charges may be accumulated on the first and second internal electrodes 121 and 122 facing each other.

In this case, capacitance of the first electronic component 100 may be in proportion to an overlapping area between the first and second internal electrodes 121 and 122 overlapping each other in the Z direction.

Voltages having different polarities may be provided to the first and second external electrodes 131 and 132, and the first and second external electrodes 131 and 132 may be electrically connected to exposed portions of the first and second internal electrodes 121 and 122, respectively.

If necessary, plating layers may be formed on surfaces of the first and second external electrodes 131 and 132 as described above.

For example, the first and second external electrodes 131 and 132 may include first and second conductive layers, first and second nickel (Ni) plating layers formed on the first and second conductive layers, and first and second tin (Sn) plating layers formed on the first and second nickel (Ni) plating layers, respectively.

Figure 4:
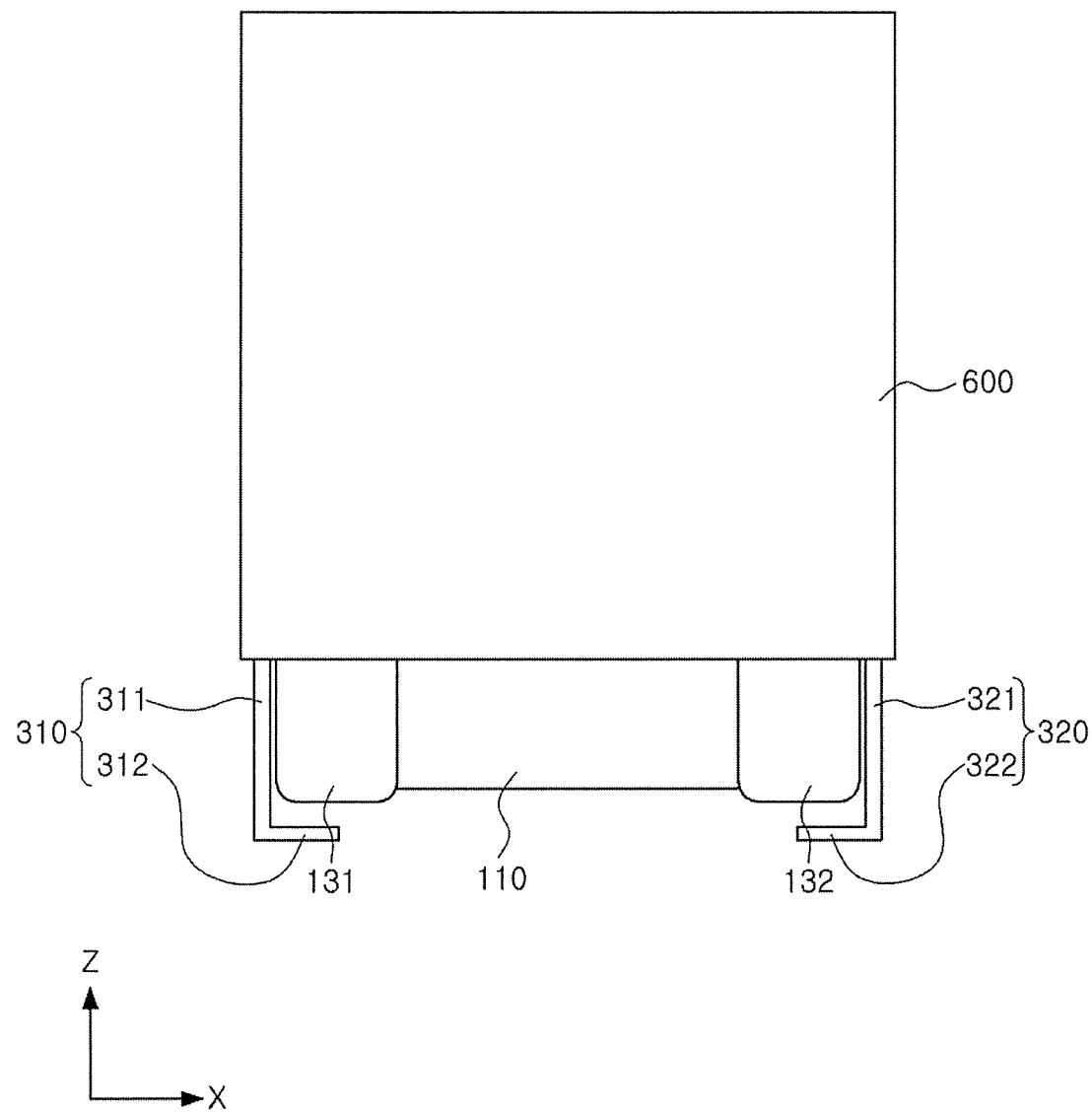
FIG. 4 is a front view schematically illustrating a multilayer electronic component having a sealing part formed thereon.
Figure 5:
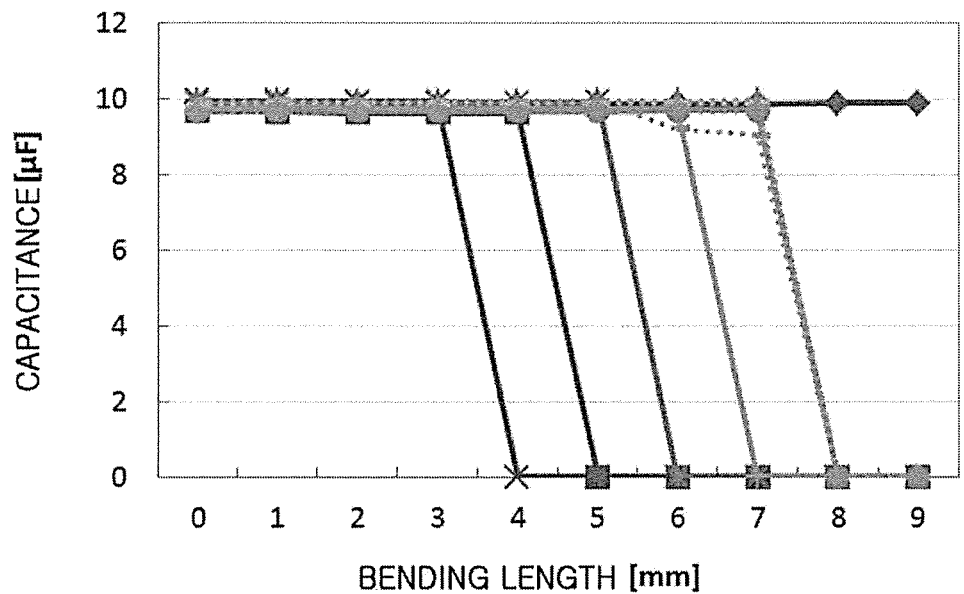
FIGS. 5 through 9 are graphs illustrating experimental capacitance measurements of multilayer electronic components for different bending lengths, the multilayer electronic components having varying adhesive spacing lengths.
Figure 6:
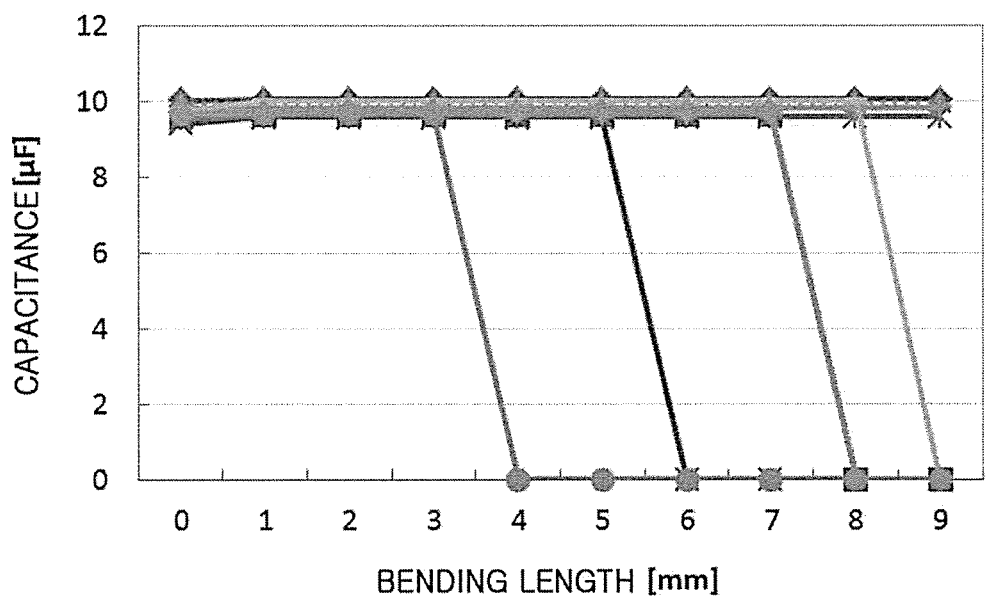
Figure 7:
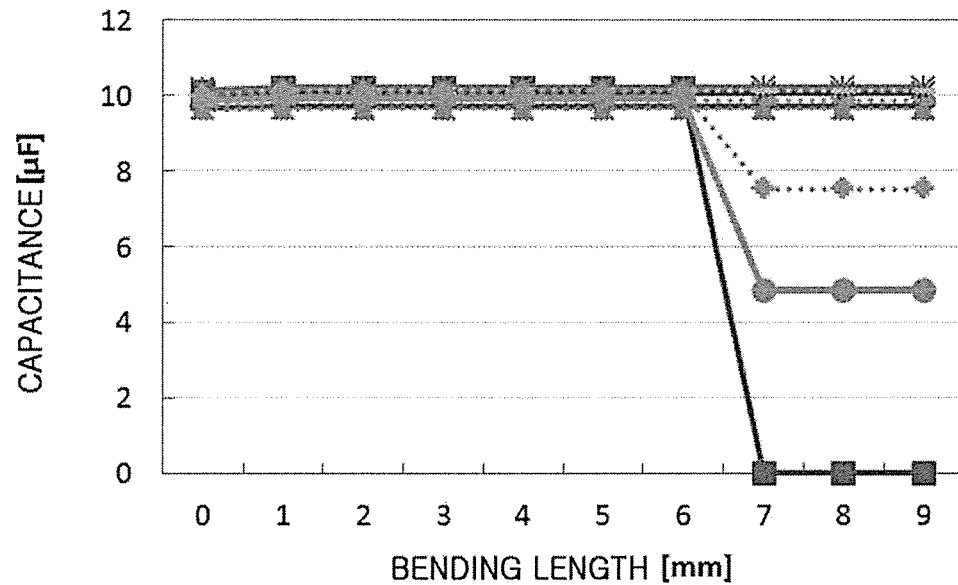
Figure 8:
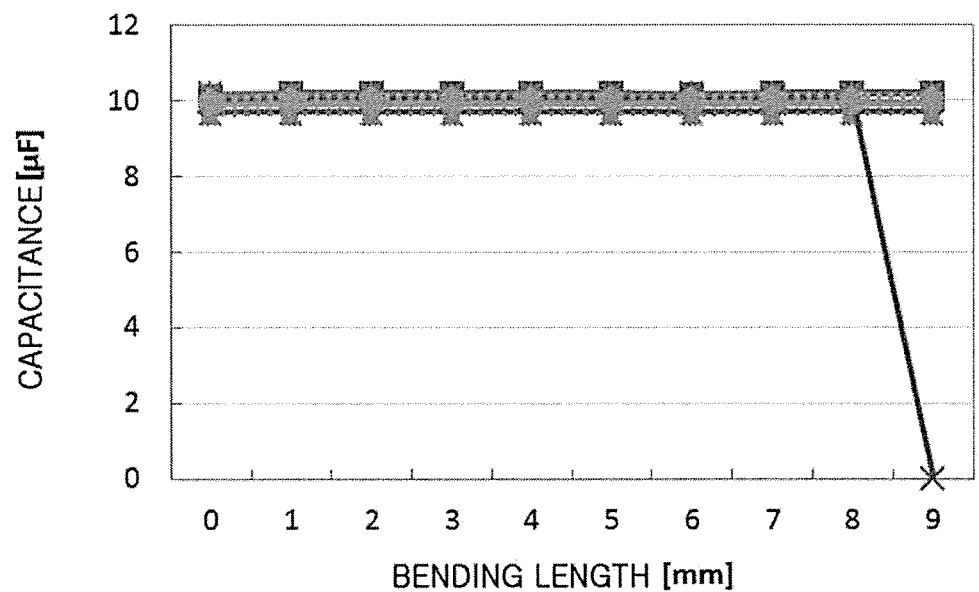

Referring to FIG. 4, the multilayer electronic component according to the present exemplary embodiment may further include a sealing part 600.

The sealing part 600 may be formed of an insulator such as an insulating resin and formed to enclose the first and second electronic components 100 and 200.

The sealing part 600 as described above may protect a product from external impact and moisture to improve reliability of the multilayer electronic component.

Here, the first and second bottom frames 312 and 322 and lower portions of the first and second side frames 311 and 321 may be exposed to the outside, such that an interval between the sealing part 600 and the mounting surface may be maintained.

Further, if necessary, the sealing part 600 may be formed to partially expose the ceramic body 110 and the first and second external electrodes 131 and 132 of the first electronic component 100.

According to the present exemplary embodiment, the first and second electronic components 100 and 200 may form a multilayer arrangement in the vertical direction, and non-adhered portions may be artificially formed between both surfaces of the first electronic component 100 positioned below the sealing part 600 and the first and second frame terminals 310 and 320.

When the non-adhered portions are formed as described above, elastic deformation of the first and second frame terminals 310 and 320 may more freely occur, and thus, mechanical or thermal stress may be further decreased. Further, an entire length of the first and second frame terminals 310 and 320 may be decreased, thereby decreasing an entire height of the multilayer electronic component while securing capacitance by the multilayer arrangement of the capacitors.

In order to evaluate bending strength depending on a length of the frame terminals 310 and 320 that do not come in contact with the first and second electronic components 100 and 200, after the multilayer electronic component to which the frame terminals are adhered is mounted on a circuit board such as a printed circuit board (PCB), or the like, at the time of applying a pressure at a predetermined speed onto the board to bend the circuit board downwardly in a state in which a surface of the circuit board on which the multilayer electronic component is mounted faces down and both sides of the board are put on a support, a degree of bending may be measured.

In this case, a change in capacitance of the multilayer electronic component may be checked together. The reason is that when cracks or delamination occurs in the first or second electronic component due to deformation of the circuit board, capacitance may be changed.

Then, results obtained by measuring the degrees of bending are illustrated in FIGS. 5 through 9, respectively.

Referring to FIGS. 5 through 9, it may be appreciated that as a height h of the non-contact portions of the side frame of the frame terminal is increased, occurrence of a defect caused by deformation of the circuit board is decreased.

Here, h is a height of a portion of the side frame of the frame terminal spaced apart from (and not connected by adhesive to) the external electrode of the first electronic component as illustrated in FIG. 2, d is a distance between the first electronic component and the mounting surface, and T1 is a height of the first electronic component.

FIGS. 5, 6, 7, 8, and 9 are graphs illustrating the results when h=0, h=d, h=(T1)/4, h=(T1)/2, and h=T1+d, respectively.

Referring to FIGS. 5 through 9, it may be appreciated that as a length of a portion of the first side frame that is not adhered to the first electronic component in the Z direction is increased, an effect of alleviating external stress may be increased, and thus, it is beneficial to secure the length of the portion of the first side frame that is not adhered to the first electronic component.

When a frame is adhered to a side surface of a capacitor, particularly, a lower side surface of the capacitor close to a circuit board as in the related art, there is a need to further secure a length of a side frame of a frame terminal extended below the capacitor in order to strengthen bending strength, which consequently causes an increase in an entire height of a component.

According to the present disclosure, since a length of portions of the side frames of the frame terminals that are not bound to the electronic component may be sufficiently secured by providing non-adhered regions that are not adhered to the side frames of the frame terminals in the side surfaces of the electronic component, a length of portions of the frame terminals extended below the capacitor in a structure according to the related art may be significantly decreased.

Figure 9:
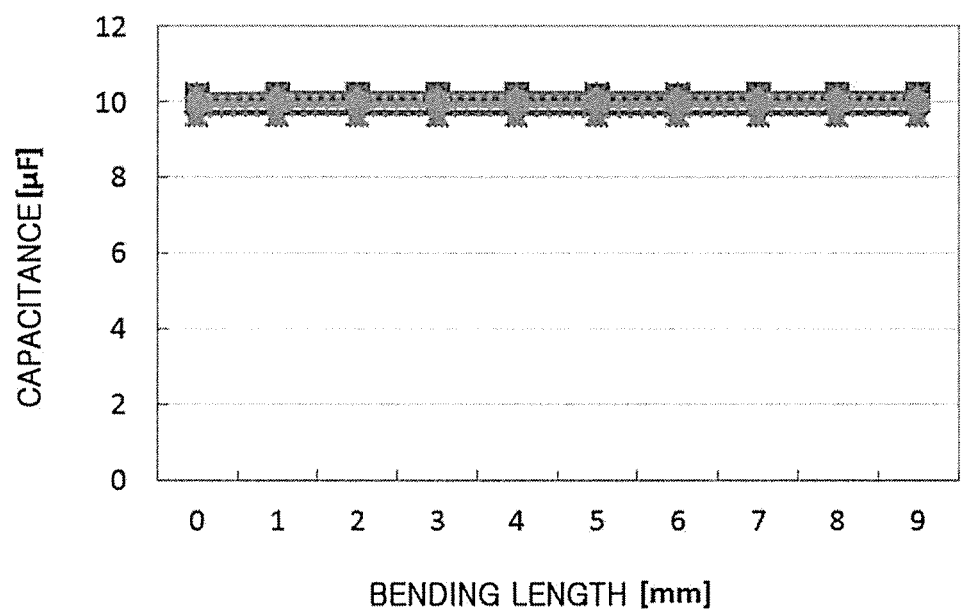

Further, in experiments according to the present disclosure, when h=T1+d as in FIG. 9, a defect did not occur in a limit range of 9 mm set as a reference value in which the bending strength may be measured. Since in view of bending strength, a criterion for reliability of a component for a vehicle is that a defect does not occur at a bending length of at least 5 mm, according to the experimental results, a lower limit of the h value in the present disclosure may be h=(T1)/4 as in FIG. 7.

In view of only the bending strength, the larger the h value, the more preferable, but since the height of the component also is important, an upper limit of h may be imposed. Further, as the h value is increased, a side effect of increasing equivalent series resistance (ESR) of the component may occur.

Therefore, an upper limit of the h value may be determined to T1+d+0.5 mm. Here, 0.5 mm is a value considered as a maximum thickness capable of being generally increased at the time of adhering first and second electronic components and a side frame of a frame terminal using a conductive adhesive in the related art.

Figure 10:
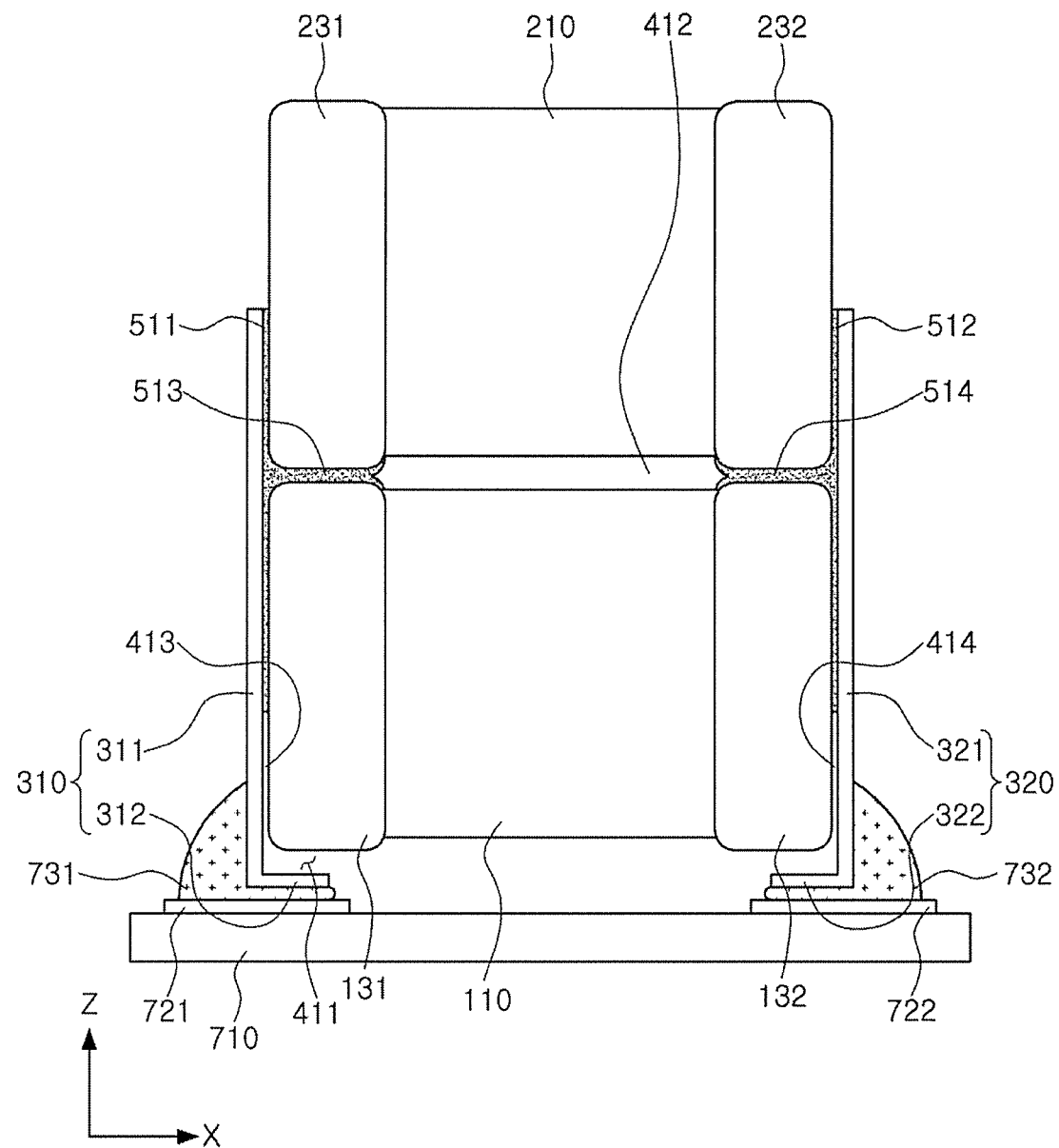
FIG. 10 is a front view illustrating a board in which the multilayer electronic component according to the exemplary embodiment is mounted.

FIG. 10 is a front view schematically illustrating a board in which the multilayer electronic component according to the first exemplary embodiment is mounted on a circuit board.

Referring to FIG. 10, the board having a multilayer electronic component according to the present exemplary embodiment may include a circuit board 710 having one surface on which first and second electrode pads 721 and 722 are formed, and the multilayer electronic component mounted on an upper surface of the circuit board 710 so that the first and second frame terminals 310 and 320 are connected to the first and second electrode pads 721 and 722, respectively.

Here, the first and second bottom frames 312 and 322 of the first and second frame terminals 310 and 320 may be connected onto the first and second electrode pads 721 and 722, respectively.

In addition, although a case in which the multilayer electronic component is mounted on the circuit board 710 by solders 731 and 732 is illustrated and described in the present exemplary embodiment, if necessary, a conductive paste, or the like, may be used instead of the solder.

As set forth above, according to exemplary embodiments presented in the disclosure, the frame terminal may absorb mechanical stress from the outside to prevent the electronic component from being damaged, and since heat generated in the electronic component may be radiated through the frame terminal, an increase in temperature of the electronic component may be suppressed, such that reliability may be improved. Further, the electronic components may be disposed in the vertical direction, such that capacitance may be secured at a predetermined level or more and an entire size of the component may be decreased.

While exemplary embodiments have been shown and described above, it will be apparent to those skilled in the art that modifications and variations could be made without departing from the scope of the present invention as defined by the appended claims.

What is claimed is:

1. A multilayer electronic component comprising:
a first frame terminal including a first side frame extended in a first direction and a first bottom frame extended from a lower end of the first side frame in a second direction;
a second frame terminal including a second side frame facing the first side frame and extended in the first direction and a second bottom frame extended from a lower end of the second side frame in a third direction opposite to the second direction;
a first electronic component disposed between the first and second side frames;
a second electronic component stacked on the first electronic component and disposed between the first and second side frames;
conductive adhesives disposed between the first and second side frames and the first and second electronic components; and
a sealing part enclosing at least portions of the first and second electronic components,
wherein regions between the first and second side frames and portions of the first electronic component directly adjacent to a mounting surface are free of conductive adhesives and free of the sealing part such that a space portion is provided therebetween.

2. The multilayer electronic component of claim 1, wherein each of the first and second electronic components includes a ceramic body and external electrodes disposed on an outer surface of the ceramic body, and
the external electrodes of the first and second electronic components are connected, to each other by a conductive adhesive.

3. The multilayer electronic component of claim 2, wherein in each of the first and second electronic components, the ceramic body includes a plurality of dielectric layers and a plurality of first and second internal electrodes alternately disposed with respective dielectric layers interposed therebetween, and has first and second surfaces opposing each other, and third and fourth surfaces connected to the first and second surfaces and opposing each other, and fifth and sixth surfaces connected to the first and second surfaces and the third and fourth surfaces and opposing each other, one end of each first and second internal electrode is exposed to the third and fourth surfaces of the body, respectively, and
the first and second external electrodes are disposed on the third and fourth surfaces of the ceramic body and connected to the first and second internal electrodes and the first and second side frames, respectively.

4. The multilayer electronic component of claim 1, wherein a lower end of the first electronic component is disposed to be spaced apart from the mounting surface.

5. The multilayer electronic component of claim 1, wherein the sealing part further surrounds at least portions of the first and second frames.

6. The multilayer electronic component of claim 1, wherein (T1)/4<h<T1+d in which h is a height of portions of the first and second side frames free of the conductive adhesives and spaced apart from the first electronic component, d is a distance between the first electronic component and the mounting surface, and T1 is a height of the first electronic component.

7. The multilayer electronic component of claim 1, wherein h<T1+d+0.5 mm in which h is a height of portions of the first and second side frames free of the conductive adhesives and spaced apart from the first electronic component, d is a distance between the first electronic component and the mounting surface, and T1 is a height of the first electronic component.

8. A board having a multilayer electronic component, the board comprising:
a circuit board having one surface on which first and second electrode pads are formed; and
the multilayer electronic component of claim 1, mounted on the first and second electrode pads so that the first and second bottom frames of the first and second frame terminals are connected to the first and second electrode pads, respectively.

9. A multilayer electronic component comprising:
a first frame terminal including a first side frame extended in a first direction and a first bottom frame extended from a lower end of the first side frame in a second direction;
a second frame terminal including a second side frame facing the first side frame and extended in the first direction and a second bottom frame extended from a lower end of the second side frame in a third direction opposite to the second direction;

a first electronic component disposed between the first and second side frames;

a second electronic component stacked on the first electronic component and disposed between the first and second side frames;

conductive adhesives disposed between the first and second side frames and the first and second electronic components, respectively; and a sealing part enclosing at least portions of the first and second electronic components, wherein regions between the first and second side frames and portions of the first electronic component close to a mounting surface are free of conductive adhesives such that a space portion is provided therebetween, and wherein the sealing part is formed to partially expose a lower portion of the first electronic component and to fully enclose the second electronic component.

10. A multilayer electronic component comprising:

a first electronic component having first and second opposing outer surfaces and third and fourth outer surfaces opposing each other in a first direction;

a second electronic component having fifth and sixth opposing outer surfaces, wherein the second electronic component is mounted facing the third outer surface of the first electronic component to have the first and fifth outer surfaces aligned with, each other and the second and sixth outer surfaces aligned with each other;

a first frame terminal adhered to the first and fifth outer surfaces, and extending over less than a full height, along the first direction, of a body of the second electronic component while extending past the fourth outer surface of the first electronic component along the first direction to include a first bottom frame;

a second frame terminal adhered to the second and sixth outer surfaces, and extending over less than a full height, along the first direction, of a body of the second electronic component while extending past the fourth outer surface of the first electronic component along the first direction to include a second bottom frame; and a sealing part enclosing at least portions of the first and second electronic components, wherein regions between the first frame terminal and a portion of the first outer surface of the first electronic component adjacent to the fourth outer surface, and between the second frame terminal and a portion of the second outer surface of the first electronic component adjacent to the fourth outer surface, are free of the sealing part such that a space portion is provided therebetween.

11. The multilayer electronic component of claim 10, wherein a first portion of the first outer surface adjacent to the fourth outer surface of the first electronic component is free of any adhesive, and a second portion of the second outer surface adjacent to the fourth outer surface of the first electronic component is free of any adhesive.

12. The multilayer electronic component of claim 11, wherein the first bottom frame extends orthogonally to a portion of the first frame terminal adhered to the first and fifth outer surfaces, and the second bottom frame extends orthogonally to a portion of the second frame terminal adhered to the second and sixth outer surfaces.

13. The multilayer electronic component of claim 12, wherein the first portion of the first outer surface that is free of any adhesive extends to a height $h1>(T1)/4$ from the first bottom frame, where T1 is a height of the first electronic component between the third and fourth surfaces, and the second portion of the second outer surface that is free of any adhesive extends to a height $h2>(T1)/4$ from the second bottom frame.

14. The multilayer electronic component of claim 12, wherein the fourth outer surface of the first electronic component is spaced apart from the first and second bottom frames by a distance $d>0$.

15. The multilayer electronic component of claim 10, further comprising:

a first conductive adhesive disposed between the first frame terminal and the first and fifth outer surfaces; and a second conductive adhesive disposed between the second frame terminal and the second and sixth outer surfaces, wherein at least a portion of the first outer surface adjacent to the fourth outer surface of the first electronic component is free of any adhesive, and at least a portion of the second outer surface adjacent to the fourth outer surface of the first electronic component is free of any adhesive.

* * * * *